(12) United States Patent
Ito et al.

(10) Patent No.: US 7,820,905 B2
(45) Date of Patent: Oct. 26, 2010

(54) THERMOELECTRIC CONVERSION DEVICE AND MANUFACTURE METHOD FOR THE SAME

(75) Inventors: Yuji Ito, Okazaki (JP); Keizou Nimura, Nagoya (JP); Akio Matsuoka, Takahama (JP); Yasuhiko Niimi, Handa (JP)

(73) Assignee: Denso Corporation, Kariya (JP)

( * ) Notice: Subject to any disclaimer, the term of this patent is extended or adjusted under 35 U.S.C. 154(b) by 677 days.

(21) Appl. No.: 11/880,631

(22) Filed: Jul. 23, 2007

(65) Prior Publication Data

US 2008/0023058 A1    Jan. 31, 2008

(30) Foreign Application Priority Data

Jul. 27, 2006 (JP) ............................. 2006-205305
May 18, 2007 (JP) ............................. 2007-133278

(51) Int. Cl.
*H01L 35/28* (2006.01)
*H01L 35/32* (2006.01)
*H01L 35/00* (2006.01)

(52) U.S. Cl. ...................... 136/225; 136/200; 136/224; 136/230

(58) Field of Classification Search ................. 136/200, 136/224, 225, 230
See application file for complete search history.

(56) References Cited

U.S. PATENT DOCUMENTS 2,305,396 A * 12/1942 Volochine ................... 374/132
5,254,178 A    10/1993 Yamada et al.

FOREIGN PATENT DOCUMENTS

JP    05-175556    7/1993

* cited by examiner

*Primary Examiner*—Basia Ridley
*Assistant Examiner*—Christina Chern
(74) *Attorney, Agent, or Firm*—Harness, Dickey & Pierce, PLC

(57) ABSTRACT

A thermoelectric conversion device and a manufacture method thereof are provided. The manufacture method includes an electrode board stamping process, an insulating frame molding process, a punching process, an element fixing process, a bending process and an insulating frame integrating process. Band-shaped plate members which function as heat radiating fins and heat absorbing fins and are integrated with insulating frame members are respectively folded-back in such a manner that the folding-back directions of the band-shaped plate members are alternately reverse to each other in the longitudinal direction of the band-shaped plate member. The insulating frame members are joined to each other to be arranged substantially in line, to construct an insulating frame unit. Thus, the component number and the assembly labor can be reduced, while the manufacture quality and the product quality can be improved.

6 Claims, 9 Drawing Sheets

AIR BLOWING DIRECTION

AIR BLOWING DIRECTION

AIR BLOWING DIRECTION

AIR BLOWING DIRECTION

THERMOELECTRIC CONVERSION DEVICE AND MANUFACTURE METHOD FOR THE SAME

CROSS REFERENCE TO RELATED APPLICATION

This application is based on a Japanese Patent Application No. 2006-205305 filed on Jul. 27, 2006 and a Japanese Patent Application No. 2007-133278 filed on May 18, 2007, the disclosures of which are incorporated herein by reference.

FIELD OF THE INVENTION

The present invention relates to a thermoelectric conversion device and a manufacture method for the same.

BACKGROUND OF THE INVENTION

A general manufacture method for a thermoelectric conversion device is disclosed, for example, with reference to JP-5-63244A and JP-5-175556A. As described in JP-5-63244A, at first, P-type thermoelectric elements and N-type thermoelectric elements are alternately arranged in line. Heat absorbing electrode portions and heat radiating electrode portions are alternately arranged in line and respectively arranged between the thermoelectric elements. Furthermore, all of the parts between the thermoelectric elements are coated by a conductive brazing material such as a solder, so that the thermoelectric elements which are arranged in line are integrated with each other.

In this case, electrode terminals are respectively arranged at two end portions of the direction in which the thermoelectric elements and the electrode portions are alternately arranged in line. One of the electrode terminals is connected with a positive terminal of a direct current power source, and the other thereof is connected with a negative terminal of the direct current power source. Thus, a thermoelectric conversion unit is assembled.

Each of the heat absorbing electrode portions is constructed of two metal plates which have a satisfactory heat-transferring performance and are adhered to each other in such a manner that the metal plates are electrically connected with each other. The heat absorbing electrode portion has a protrusion portion which protrudes to the one side of a right angle direction from the row of the thermoelectric elements. The protrusion portion constructs a fin for absorbing heat.

Next, the manufacture method of the thermoelectric conversion device according to JP-5-175556A will be described. At first, multiple heat radiating plates and multiple heat absorbing plates are prepared. Each of the heat radiating plates and the heat absorbing plates has a U-like shape and provided with a bottom portion and a pair of foot portions extending from the bottom portion. Then, the heat radiating plate is made penetrate a partition plate of a heat radiation side, in such a manner that the bottom portion of the heat radiating plate is positioned at one side and the pair of foot portions of the heat radiating plate are positioned at the other side. Thus, the multiple heat radiating plates are attached to the partition plate of the heat radiating side with a matrix shape. Similarly, the heat absorbing plate is made penetrate a partition plate of a heat absorbing side, in such a manner that the bottom portion of the heat absorbing plate is positioned at one side and the pair of foot portions of the heat absorbing plate are positioned at the other side. Thus, the multiple heat absorbing plates are attached to the partition plate of the heat absorbing side with a matrix shape.

Thereafter, the partition plates are faced to each other to sandwich therebetween the P-type thermoelectric elements and N-type thermoelectric elements which are alternately arrayed, in such a manner that the P-type thermoelectric elements and N-type thermoelectric elements are connected in series by the bottom portion of the heat radiating plate and the bottom portion of the heat absorbing plate. The bottom portions are integrally joined to the P-type thermoelectric elements and N-type thermoelectric elements by soldering. Thus, the thermoelectric conversion device is assembled.

However, according to the manufacture methods of the thermoelectric conversion devices according to JP-5-63244A and JP-5-175556A, it is difficult to assemble the heat absorbing electrodes, the heat radiating electrodes and the thermoelectric elements. In this case, the heat absorbing electrode portions, the heat radiating electrode portions and the thermoelectric elements are arranged at predetermined positions and joined by soldering or the like, to be assembled. Moreover, the number of the components is large to require a lot of labor for assembling, to be unsuitable for a manufacture in quantity. Furthermore, migration will occur at the conductive portion between the electrode portions, in the case where condensation water adheres. Moreover, when condensation water freezes so that the volume of condensation water is expanded, the thermoelectric conversion device will be broken.

SUMMARY OF THE INVENTION

In view of the above-described disadvantage, it is an object of the present invention to provide a thermoelectric conversion device and a manufacture method for the same to reduce a component number and an assembling labor while stable quality is provided and migration is restricted.

According to a first aspect of the present invention, a manufacture method of a thermoelectric conversion device is provided with an electrode board constructing process, an insulating frame molding process, a cutting process, an element fixing process, a bending process and an insulating frame integrating process. The electrode board constructing process is performed to construct an electrode board, where a plurality of band-shaped plate members extending in a longitudinal direction thereof are arrayed in rows with respect to a lateral direction thereof in such a manner that the band-shaped plate members are spaced from each other at a predetermined distance in the lateral direction and a plurality of bridge portions are arrayed in rows with respect to the longitudinal direction of the band-shaped plate member in such a manner that the bridge portions are spaced from each other at a predetermined distance in the longitudinal direction of the band-shaped plate member. Each of the bridge portions connects the band-shaped plate members with each other in the lateral direction of the band-shaped plate member. The insulating frame molding process is provided to mold a plurality of insulating frame members integrally with the electrode board in such a manner that the insulating frame members are spaced from each other at a predetermined distance in the longitudinal direction of the band-shaped plate member. The insulating frame member is positioned at two sides of the longitudinal direction of the bridge portion and spaced from the bridge portion at a predetermined distance. The insulating frame member has a pair of first frame portions which connect the plurality of band-shaped plate members in the lateral direction of the band-shaped plate member, and a pair of second frame portions which connect the pair of first frame portions. The cutting process is provided to cut the bridge portion in such a manner that the band-shaped plate member has a remainder remained in the insulating frame member. The element fixing process is performed to electrically join P-type thermoelectric elements and N-type thermoelectric elements in the insulating frame member to the remainder. The bending process is performed to respectively fold-back the band-shaped plate members positioned between the adjacent insulating frame members, in such a manner that folding-back directions of the band-shaped plate members are alternately reverse to each other in the longitudinal direction thereof. The insulating frame integrating process is performed to join the plurality of insulating frame members to each other to construct an insulating member unit in such a manner that the plurality of insulating frame members are arranged substantially in line.

Thus, the band-shaped plate member which functions as a heat radiating fin or a heat absorbing fin when the current is supplied can be readily constructed with a reduced component number. Therefore, the assembly can be simplified, and the manufacture quality and the product quality can be improved.

Moreover, the band-shaped plate members which are integrated with the insulating frame members are respectively folded-back (bent) in such a manner that the folding-back directions of the band-shaped plate members are alternately reverse to each other in the longitudinal direction. In this case, the multiple insulating frame members are joined to each other in such a manner that the insulating frame members are arranged substantially in line, to construct the insulating frame unit. Thus, the component number and the assembly labor can be reduced, while the manufacture quality and the product quality can be improved.

Furthermore, the surrounding of the thermoelectric element is encompassed by the insulating frame member, so that the shorten circuit and the migration between the electrode portions can be restricted.

According to a second aspect of the present invention, a manufacture method of a thermoelectric conversion device is provided with an electrode board constructing process, a punching process, an insulating frame assembling process, an element fixing process, a bending process and an insulating frame integrating process. The electrode board constructing process is performed to construct an electrode board, where a plurality of band-shaped plate members extending in a longitudinal direction thereof are arrayed in rows with respect to a lateral direction thereof in such a manner that the band-shaped plate members are spaced from each other at a predetermined distance in the lateral direction and a plurality of bridge portions are arrayed in rows with respect to the longitudinal direction of the band-shaped plate member in such a manner that the bridge portions are spaced from each other at a predetermined distance in the longitudinal direction of the band-shaped plate member. Each of the bridge portions connects the band-shaped plate members with each other in the lateral direction of the band-shaped plate member. The punching process is performed to punch the bridge portion such that the band-shaped plate member is divided in the longitudinal direction thereof into division band-shaped plate portions each of which has an end constructing an electrode terminal. The insulating frame assembling process is performed to assemble a plurality of insulating frame members with the electrode board in such a manner that the insulating frame members are spaced from each other at a predetermined distance in the longitudinal direction of the band-shaped plate member. The insulating frame member is positioned at two sides of the longitudinal direction of the bridge portion and spaced from the bridge portion at a predetermined distance. The insulating frame member has two frame portions which connect the plurality of band-shaped plate members in the lateral direction of the band-shaped plate member and sandwich therebetween the electrode terminal in such a manner that the electrode terminal is exposed in a space defined by the frame portions therebetween. The element fixing process is provided to electrically join P-type thermoelectric elements and N-type thermoelectric elements in the insulating frame member to the electrode terminals. The bending process is performed to respectively fold-back the division band-shaped plate portions positioned between the adjacent insulating frame members, in such a manner that folding-back directions of the division band-shaped plate portions are alternately reverse to each other in the longitudinal direction thereof. The insulating frame integrating process is performed to join the plurality of insulating frame members to each other to construct an insulating member unit in such a manner that the plurality of insulating frame members are arranged substantially in line.

In this case, the band-shaped plate members which are integrated with the insulating frame members are respectively folded-back (bent) in such a manner that the folding-back directions of the band-shaped plate members are alternately reverse to each other in the longitudinal direction. The multiple insulating frame members are joined to each other in such a manner that the insulating frame members are arranged substantially in line, to construct the insulating frame unit. Thus, the component number and the assembly labor can be reduced, while the manufacture quality and the product quality can be improved.

Furthermore, the surrounding of the thermoelectric element is encompassed by the insulating frame member, so that the shorten circuit and the migration between the electrode portions can be restricted.

According to a third aspect of the present invention, a thermoelectric conversion device includes a plurality of P-type thermoelectric elements and a plurality of N-type thermoelectric elements which are alternately connected with each other in series to construct a series circuit, a plurality of plate portions for absorbing heat and a plurality of plate portions for radiating heat which are electrically conductive and respectively electrically connected with the thermoelectric elements, and an insulating unit which is electrically insulating and houses therein the thermoelectric elements and to which the plate portions for absorbing heat and the plate portions for radiating heat are fixed. The plate portion for absorbing heat and the plate portions for radiating heat are respectively arranged at two sides of the insulating unit. The plate portions which are positioned at the one side of the insulating unit and respectively connected with the adjacent thermoelectric elements are constructed of a single band-shaped plate member, and integrally joined to each other at an outer side of the insulating unit.

Thus, the component number and the assembly labor can be reduced, while the manufacture quality and the product quality can be improved.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE EXAMPLED EMBODIMENTS

First Embodiment

A thermoelectric conversion device 20 and a manufacture method thereof according to a first embodiment of the present invention will be described with reference to FIGS. 1-15.

Figure 1:
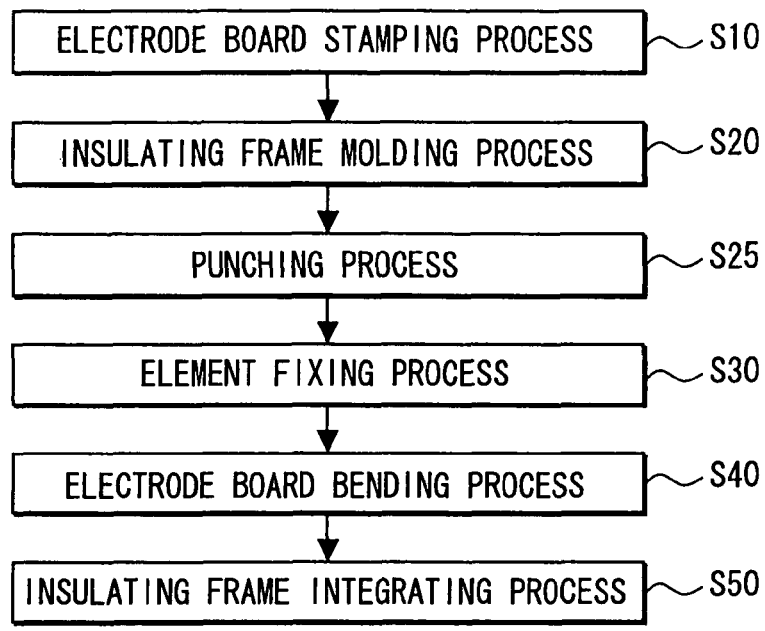
FIG. 1 is a flow chart showing manufacture processes of a thermoelectric conversion device according to a first embodiment of the present disclosure.

As shown in FIG. 1, the manufacture method for the thermoelectric conversion device 20 includes an electrode board stamping process (step S10), an insulating frame molding process (step S20), a punching process (step S25), an element fixing process (step S30), a bending process (step S40) and an insulating frame integrating process (step S50).

In the electrode board stamping process, an electrode board 1 including multiple band-shaped plate members, multiple bridge portions 5, and power connection portions 2 and 3 arranged at two ends of the electrode board 1 is formed to have a substantially rectangular shape or the like on the whole.

Figure 2:
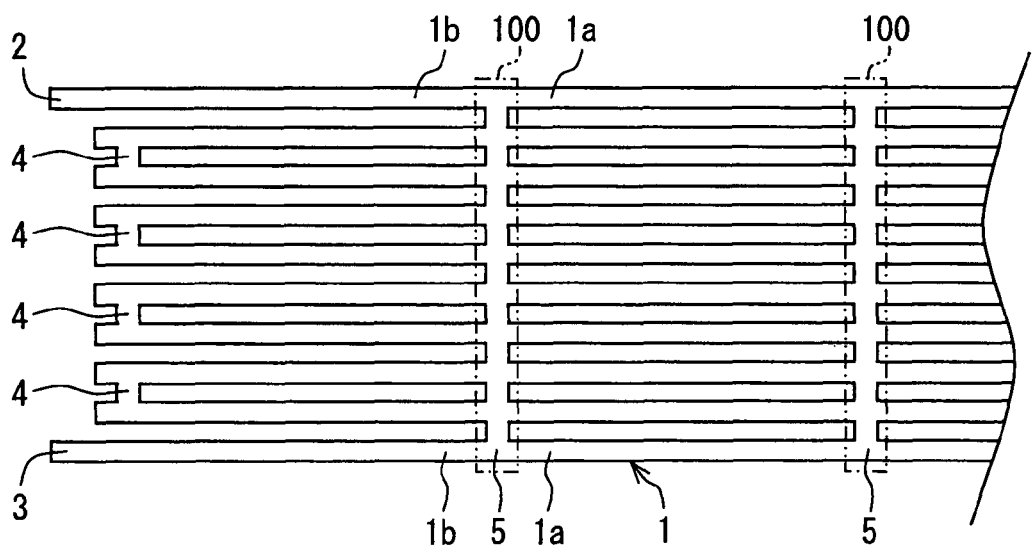
FIG. 2 is a plan view showing an electrode board after a punching process of step S25 in FIG. 1 is performed.

As shown in FIG. 2, the multiple band-shaped plate members which extend in the longitudinal direction of the electrode board 1 are arrayed in multiple rows with respect to the lateral direction of the electrode board 1. That is, the band-shaped plate members (extending in longitudinal direction thereof) are arranged to be substantially parallel to each other with respect to the lateral direction of the electrode board 1. Moreover, the band-shaped plate members are spaced from each other at a predetermined distance in the lateral direction.

The bridge portions 5 are arrayed in multiple rows with respect to the longitudinal direction of the electrode board 1, to connect the multiple band-shaped plate members in the lateral direction of the electrode board 1.

The power connection portions 2 and 3 are electrically connected with each other by the multiple band-shaped plate members. The electrode board 1 shown in FIG. 2 can be formed by stamping a thin plate having a predetermined size and a substantially rectangular shape or the like by a stamping machine.

It is desirable that the thin plate of which the electrode board 1 is constructed is made of a material (for example, copper and brass) having a low electrical resistance. The thickness of the thin plate is suitably determined so that the consumption power of the thermoelectric conversion device 20 and the heat radiating capacity of a heat radiating electrode and a heat absorbing electrode respectively have desirable values. For example, the thickness can be in a range from 0.2 mm to 0.3 mm.

Next, the electrode board 1 formed by the electrode board stamping process (electrode board constructing process) will be described.

The electrode board 1 includes the slender band-shaped plate members which are connected with each other in series from the power connection portion 2 to the power connection portion 3. The band-shaped plate member includes heat-radiating-side plate portions 1b, portions (arrangement portions of P-type thermoelectric elements 9) where P-type thermoelectric elements 9 will be arranged at step S30, heat-absorbing-side plate portions 1a, and portions (arrangement portions of N-type thermoelectric elements 9) where N-type thermoelectric elements 9 will be arranged at step S30. The heat-radiating-side plate portions 1b, the arrangement portion of the P-type thermoelectric element 9, the heat-absorbing-side plate portion 1a, the arrangement portion of the N-type thermoelectric element 9, and the plate portion 1b are sequentially connected in the longitudinal direction of the band-shaped plate member (that is, longitudinal direction of electrode board 1). In this case, the heat-radiating-side plate portions 1b and the heat-absorbing-side plate portion 1a extend in the longitudinal direction of the electrode board 1.

This band-shaped plate member can be constructed such that the connection of the above-described parts is repeated for several times. That is, the length of the band-shaped plate member can be adjusted corresponding to the length of the longitudinal direction and the required capacity of the thermoelectric conversion device 20. The plate portion 1a and the plate portion 1b are division band-shaped plate portions into which the band-shaped plate member is divided in the longitudinal direction thereof.

The band-shaped plate members formed as described above are provided with folded-back portions at the two longitudinal-direction ends of the electrode board 1 to be folded back, so that the band-shaped plate members extend with a serpentine shape. In this case, the multiple folding-back portions are formed at the longitudinal-direction end portions of the electrode board 1, so that the plate portions 1a (1b) can be arrayed in multiple rows with respect to the lateral direction of the electrode board 1 and spaced from each other at the predetermined distance in the lateral direction.

That is, the plate portions 1a of the heat absorbing side which constructs the heat absorbing portion when the electric current flows in the electrode board 1 are arrayed in rows with respect to the lateral direction of the electrode board 1 and spaced from each other at the predetermined distance in the lateral direction. In the vicinity of the plate portions 1a (which are arrayed in rows), the arrangement portions of the P-type thermoelectric elements 9 and the arrangement portions of the N-type thermoelectric elements 9 are alternately disposed and arrayed in rows with respect to the lateral direction of the electrode board 1.

Furthermore, in the vicinity of the arrangement portions of the P-type thermoelectric elements 9 and the arrangement portions of the N-type thermoelectric elements 9 (which are alternately arrayed in rows with respect to lateral direction of electrode board 1), the plate portions 1b of the heat radiating side are arrayed in rows with respect to the lateral direction and spaced from each other at the predetermined distance in the lateral direction.

Furthermore, in the electrode board stamping process, electrode terminals 1c which will be joined to the P-type thermoelectric element 9 and the N-type thermoelectric element 9 by brazing or the like at step S30 (which will be performed later) are formed together with the plate portions 1a and 1b and the arrangement portions of the P-type thermoelectric element 9 and the N-type thermoelectric element 9.

Figure 8:
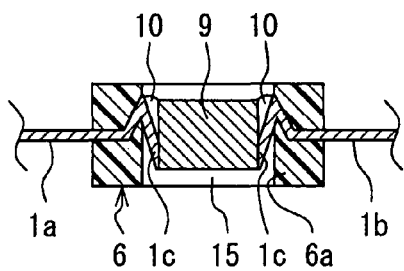
FIG. 8 is a schematic sectional view taken along a line XIII-XIII in FIG. 5.

As shown in FIG. 8, the electrode terminal 1c of the plate portion 1a, 1b is formed to have a bent shape to protrude downwards from the surface of the plate portion 1a, 1b. The plane portion connecting the electrode terminal portions 1c of the two sides (that is, two electrode terminal portions 1c positioned at plate portion 1a and plate portion 1b which are adjacent to each other) with each other will be punched at the punching process (step S25). A brazing material can be pasted to the inner side surfaces of the electrode terminals 1c (positioned at plate portion 1a and plate portion 1b which are adjacent to each other) which face each other to construct joining surfaces joined to the thermoelectric elements 9.

FIG. 8 shows a state where this plane portion has been punched and the electrode terminal 1c and the thermoelectrical element 9 have been fixed to each other by brazing in the element fixing process. Before being punched, the plane portion is arranged at a position corresponding to the bottom portion of the thermoelectrical element 9 shown in FIG. 8.

Multiple connection portions 4 are arranged at the folded-back portions to connect the multiple plate portions 1a of the heat absorbing side (or multiple plate portions 1b of heat radiating side) with each other, which are arrayed in rows with respect to the lateral direction of the electrode board 1 and spaced from each other at the predetermined distance.

The above-described band-shaped plate members are folded back in the longitudinal direction of the electrode board 1 from the power connection portion 2 to the power connection portion 3 by the connection portions 4, to form the electrode board 1 having the substantial rectangular shape on the whole. Due to the connection portion 4, the plate members can be folded back at the two longitudinal-direction ends thereof, so that the plate members which are continuous from the power connection portion 2 to the power connection portion 3 can be formed. Moreover, the connection portion 4 functions as a reinforcement portion for maintaining the electrode board 1 to have a stable shape as shown in FIG. 2.

Moreover, in the electrode board stamping process, the bridge portion 5 for connecting the plate portions 1a and the plate portions 1b which are arrayed in rows with respect to the lateral direction of the electrode board 1 are formed to be spaced from each other at a predetermined distance in the longitudinal direction of the electrode board 1. The bridge portion 5 is formed integrally with the plate portion 1a and the plate portion 1b, as a reinforcement portion for maintaining the electrode board 1 to have a stable shape. Particularly, the longitudinal-direction parts of the electrode board 1 can be provided with a stable shape in the lateral direction of the electrode board 1, because of the bridge portion 5. The bridge portion 5 can be positioned in the insulating frame member 6 which is formed at the later insulating frame molding process and indicated by the chain double-dashed line in FIG. 2.

As described above, in the electrode board stamping process, as shown in FIG. 2, the plate portion 1a, the plate portion 1b, the connection portion 4, and the bridge portion 5 are remained and other slit portions and the like are punched so that the electrode board 1 is formed. Moreover, the width of each of the plate portion 1a and the plate portion 1b is substantially equal to or somewhat larger than the width of the thermoelectrical element 9 which will be fixed by the element fixing process (step S30).

Furthermore, it is describable to apply a coating to the electrode board 1 between the electrode board stamping process and the insulating frame molding process of step S20. For example, gold coating, nickel coating and the like can be applied to the electrode board 1. In this embodiment, nickel coating is provided. The plate portion 1a and the plate portion 1b to which the nickel coating has been applied can improve the solder wettability when the thermoelectrical element 9 and the plate portions 1a and 1b are soldered at the later element fixing process.

Moreover, the stamping process (electrode board constructing process) of the electrode board 1 can be also performed by a cutting-off process where laser is used to cut off the material.

When the plate portion 1a and the plate portion 1b are respectively used as the heat-absorbing electrode portion (heat-absorbing fin) and the heat-radiating electrode portion (heat-radiating fin) of the thermoelectric conversion device 20, it is considered that condensation water will adhere to these electrode portions (fins). Thus, migration will occur at the electrode portions having a potential difference therebetween due to condensation water. Moreover, tracking will be caused.

According to this embodiment, the nickel coating is applied to the plate portion 1a and the plate portion 1b, so that the occurrence of the migration can be relieved because nickel is resistant of ionization.

As described above, the electrode board 1 is stamped at the stamping process (electrode board constructing process). The electrode board 1 is provided with the power connection portions 2, 3 arranged at the two ends of the electrode board 1, and the band-shaped plate members extending in the longitudinal direction of the electrode board 1. The band-shaped plate members are arrayed in rows with respect to the lateral direction of the electrode board 1 and spaced from each other in the lateral direction. The bridge portions 5 are spaced from each other at the predetermined distance in the longitudinal direction of the electrode board 1. Thus, the bridge portion 5 connects the adjacent band-shaped plate members which are arrayed in rows with respect to the lateral direction. The power connection portion 2 and the power connection portion 3 are connected with each other by the band-shaped plate members.

Next, in the insulating frame molding process (step S20), the multiple insulating frame members 6 are arranged at the electrode board 1 in such a manner that the insulating frame members 6 are spaced from each other in a predetermined distance in the longitudinal direction of the electrode board 1. In this case, the insulating frame member 6 (which surrounds bridge portion 5) is arranged at the two sides of the longitudinal directing of the bridge portion 5, and spaced from the bridge portion 5 at a predetermined distance.

The insulating frame member 6 includes a pair of first frame portions 6a through which the multiple band-shaped plate members are connected with each other through the lateral direction of the electrode board 1, and two second frame portions 6b which connects the pair of first frame portions 6a with each other.

The multiple insulating frame members 6 are integrally molded with the electrode board 1 by die, in such a manner that the insulating frame members 6 surround the arrangement portions of the P-type thermoelectric elements 9 and those of the N-type thermoelectric elements 9 at the electrode board 1 having been formed at the electrode board stamping process.

The insulating frame member 6 is provided with a substantial rectangular shape and a predetermined thickness. The first frame portions 6a of the insulating frame member 6 are arranged to surround therebetween the whole (with respect to lateral direction of electrode board 1) of the bridge portion 5 and parts of the band-shaped plate members which are positioned at the two sides of the bridge portion 5 and have a predetermined length.

Figure 3:
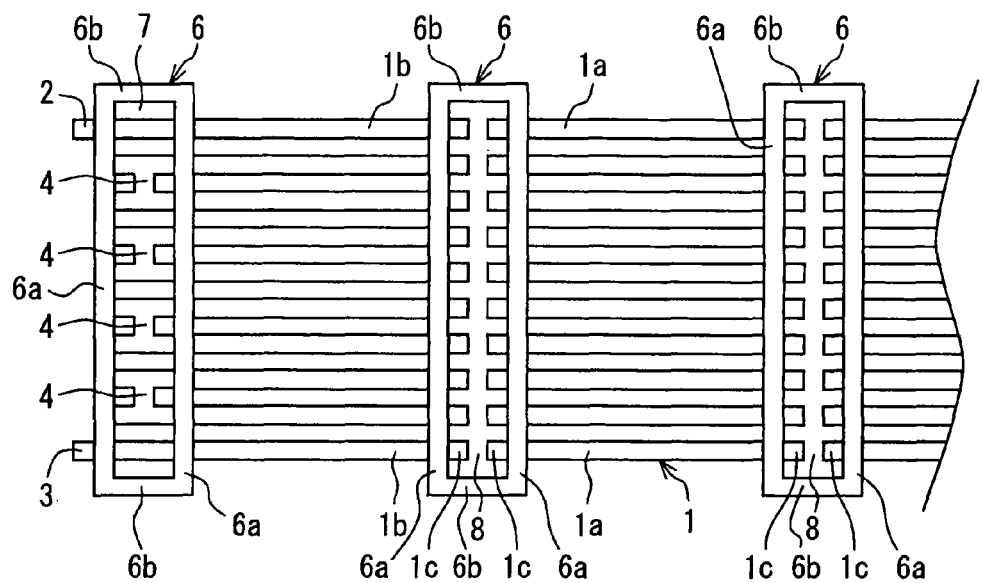
FIG. 3 is a plan view showing a product after the punching process of step S25 in FIG. 1 is performed.

Each of the first frame portion 6a and the second frame portion 6b has a predetermined depth in a direction (that is, direction from the facade side to the back side of the paper of FIG. 3) which is perpendicular to the longitudinal direction of the insulating frame member 6.

The insulating frame member 6 defines therein a space (housing portion 15) surrounded by the first frame portion 6a and the second frame portion 6b. This space is opened at two ends of the direction perpendicular to the longitudinal direction of the insulating frame member 6 (that is, end of facade side and end of back side of paper of FIG. 3 of insulating frame member 6). The housing portions 15 construct the arrangements portion of the P-type thermoelectric element 9 and the N-type thermoelectric element 9 at the element fixing process of step S30.

The insulating frame members 6 which are arrayed in rows with respect to the longitudinal direction of the electrode board 1 are formed, in such a manner that the electrode terminals 1c (arrayed in rows with respect to lateral direction of electrode board 1) and the above-described plane portions connecting these electrode terminals 1c are arranged in the housing portion 15 of each of the insulating frame members 6. Thus, after the plane portion is punched at the later punching process, the electrode terminal 1c can be formed at the inner side of the insulating frame member 6 and the electrode portion surrounded by the insulating material can be ensured.

As shown in FIG. 3, the insulating frame members 6 are spaced from each other in the longitudinal direction of the electrode board 1 in such a manner that the insulating frame member 6 surrounds the arrangement portions of the P-type thermoelectric element 9 and the N-type thermoelectric element 9.

The length of the insulating frame member 6 is set such that all of the arrangement portions of the P-type thermoelectric elements 9 and those of the N-type thermoelectric elements 9 which are arrayed in rows through the whole lateral-direction length of the electrode board 1 are housed in the insulating frame member 6 (that is, in the housing portion 15).

Moreover, each of the insulating frame members 6 is formed such that the bridge portion 5 is also housed in the insulating frame member 6 (that is, in the housing portion 15). FIG. 3 shows a product formed after the later punching process of step S25 is performed.

Figure 6:
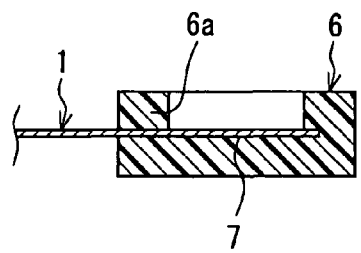
FIG. 6 is a schematic sectional view taken along a line XI-XI in FIG. 5.
Figure 7:
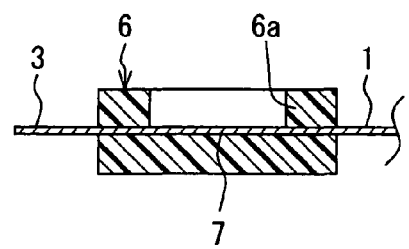
FIG. 7 is a schematic sectional view taken along a line XII-XII in FIG. 5.

As shown in FIGS. 6 and 7, the insulating frame members 6 are integrated with the plate portion 1a and the plate portion 1b, in such a manner that the plate portion 1a and the plate portion 1b are inserted into the first frame portions 6a or penetrate the first frame portions 6a. The insulating frame members 6 are fixed to the plate portion 1a and the plate portion 1b by adhering or the like, to be integrated with the electrode board 1.

That is, it can be said that a resin material constructing the insulating frame member 6 is adhered to a part of the electrode board 1 and that the resin material is formed to envelop the arrangement portions of the P-type thermoelectric element 9 and the N-type thermoelectric element 9. Therefore, this molding process can be also called an outsert molding or an insert molding.

Each of the insulating frame members 6 which are respectively arranged at the two ends of the longitudinal direction of the electrode board 1 is provided with a bottom portion 7 which is substantially parallel to the plate portion 1a and the plate portion 1b. The bottom portions 7 function as covers to close the interior of the insulating frame members 6 which are integrated at the later insulating frame integrating process. Because the interior of the insulating frame members 6 is formed into the closed space, humidity can restricted from intruding. Thus, the condensation of the housing portion 15 and the corrosion of the thermoelectric element 9 and the like can be restricted.

It is desirable for the closed space to be filled with a material (for example, argon and chlorofluorocarbon) having a lower heat-conductivity than air. Moreover, it is desirable for the closed space to have a vacuum state or have a low pressure state where air exists and which is close to the vacuum state.

Moreover, the insulating frame member 6 can be constructed of the resin material such as glass epoxy, LCP resin, phenolic resin, Polyphenylene sulfide (PPS) and the like, considering the heat resistance in soldering. Alternatively, the insulating frame member 6 can be constructed of a thermoplastic resin or a thermosetting resin, considering the die cost and the working cost.

As described above, the insulating frame molding process is performed to integrate the insulating frame members 6 with the electrode board 1 in such a manner that the insulating frame members 6 are spaced from each other at the predetermined distance in the longitudinal direction of the electrode board 1. Each of the insulating frame members 6 is arranged at the two sides (of longitudinal direction of electrode board 1) of the bridge portion 5 and spaced from the bridge portion 5 at the predetermined distance. The insulating frame member 6 has the pair of first frame portions 6a which extend through the lateral direction of the electrode board 1, and the second frame portion 6b connecting the pair of first frame portion 6a with each other.

Next, the punching process (step S25, cutting process) is performed to disconnect the bridge portion 5 in such a manner that the band-shaped plate member is remained in the insulating frame member 6. As shown in FIG. 3, the punching process is performed after the insulating frame molding process (step S20), to punch the part of the electrode board 1 which is surrounded by the chain double-dashed line 100 in FIG. 2 by stamping machine or the like.

In the punching process, the above-described plane portions (arrangement portions of P-type thermoelectric element 9 and N-type thermoelectric element 9) at all of the insulating frame members 6 are punched in a die in such a manner that all of the thermoelectric elements 9 can be arranged in the housing portions 15 in the insulating frame members 6. Moreover, in the punching process, separation portions 8 are formed so that the plate portion 1a and the plate portion 1b are separated from each other. Thus, only the electrode terminal portion 1c is remained in the insulating frame member 6. Alternatively, the punching process can also be performed by cutting-off by laser or the like.

In this case, because the end surface of the separation portion 8 and the disconnection end surface of the bridge portion 5 are positioned in the insulating frame member 6 to be surrounded, the migration due to condensation water and the like can be restricted although the coating at the end surface of the separation portion 8 and the disconnection end surface of the bridge portion 5 are unstuck.

The electrode terminal 1c is formed in the above-described punching process (cutting process). In this case, the part of the band-shaped plate member surrounded by the insulating frame member 6 is punched so that the plate portion 1a and the plate portion 1b (that is, division band-shaped plate portions into which band-shaped plate member is divided in the longitudinal direction thereof) are formed and the ends of the division band-shaped plate portions are exposed to the interior of the insulating frame member 6 to construct the electrode terminal 1c.

Next, in the element fixing process of step S30, the P-type thermoelectric elements 9 and the N-type thermoelectric elements 9 are arranged in the housing portion 15 which is surrounded by the insulating frame member 6 to be constructed, in such a manner that the P-type thermoelectric elements 9 and the N-type thermoelectric elements 9 are alternately arrayed in series in the lateral direction of the electrode board 1.

In this case, the P-type thermoelectric elements 9 and the N-type thermoelectric elements 9 are conductively fixed to the electrode terminal 1c, and alternately arranged at the separation portion 8 which extends in the lateral direction of the electrode board 1.

Figure 4:
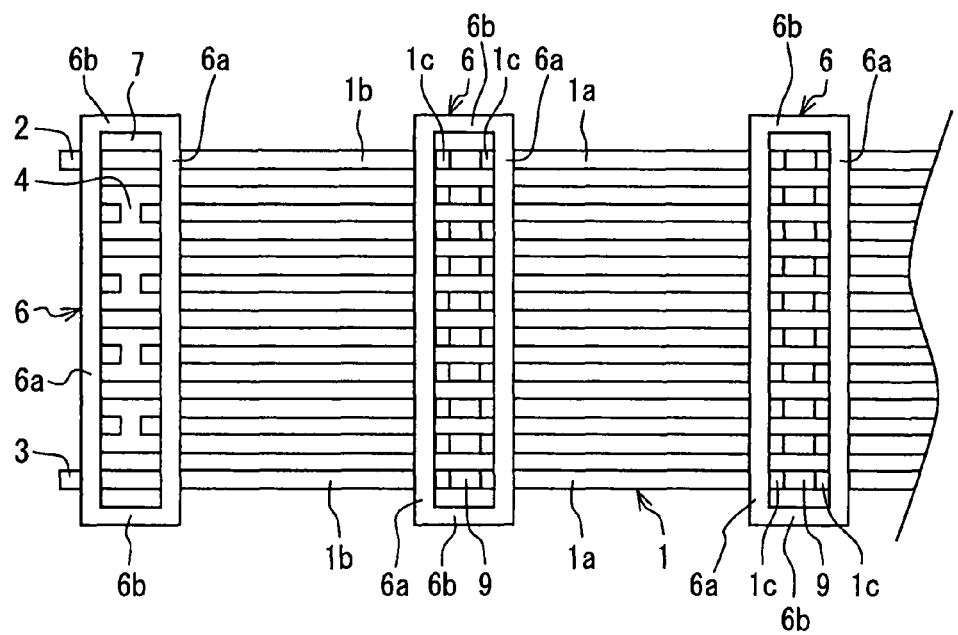
FIG. 4 is a plan view showing a product after an element fixing process of step S30 in FIG. 1 is performed.
Figure 5:
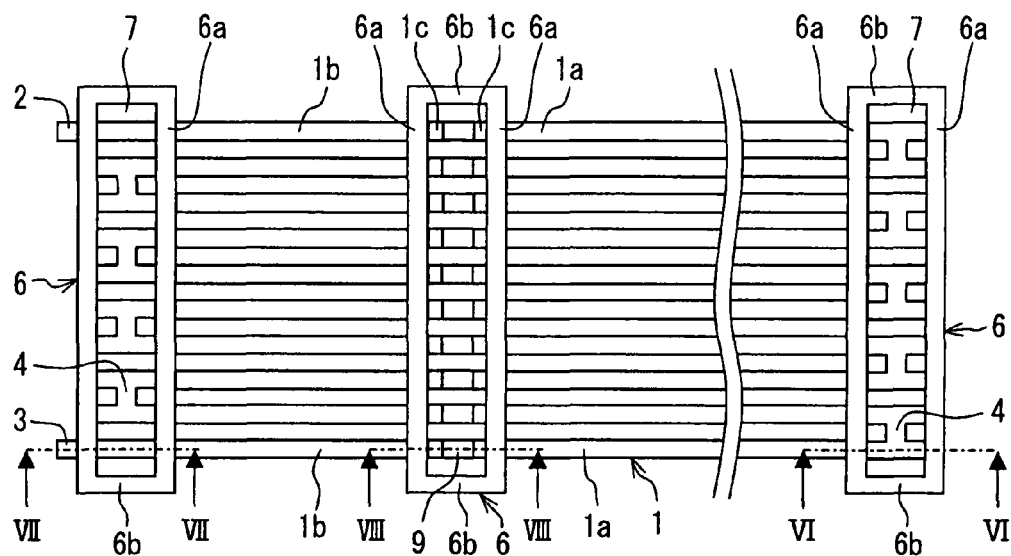
FIG. 5 is a plan view showing a whole construction of a thermoelectric conversion module before a bending process of step S40 is performed.

As shown in FIGS. 4, 5 and 8, the P-type thermoelectric elements 9 and the N-type thermoelectric elements 9 are joined (by soldering) to the electrode terminal 1c (which penetrates the first frame portion 6a of the insulating frame member 6) in the housing portion 15.

FIG. 4 shows the product after the element fixing process (step S30) has been performed. FIG. 5 shows the whole of a thermoelectric conversion module (thermoelectric conversion device) before the bending process of step S40.

Specifically, a paste solder or the like is applied to (by dispenser or the like) a surface of the electrode terminal 1c in the housing portion 15. Furthermore, the P-type thermoelectric elements 9 and the N-type thermoelectric elements 9 are mounted by a chip mounter or the like, to be arranged at the separation portions 8 (which are spaced from each other at a predetermined distance in the longitudinal direction of the electrode board 1) and alternately arrayed in the lateral direction of the electrode board 1.

Then, the electrode terminal 1c and the thermoelectric elements 9 are soldered in a reflow furnace or the like. For example, the P-type thermoelectric element 9 is constructed of a P-type semiconductor made of Bi—Te compound, and the N-type thermoelectric element 9 is constructed of a N-type semiconductor made of Bi—Te compound.

The above-described element fixing process is performed to alternately arrange the P-type thermoelectric element 9 and the N-type thermoelectric element 9 between the adjacent electrode terminal portions 1c (formed in punching process), so that the P-type thermoelectric elements 9 and the N-type thermoelectric elements 9 are integrated with the electrode terminal 1c and arrayed in series. That is, the element fixing process is performed to electrically join the P-type thermoelectric elements 9 and the N-type thermoelectric elements 9 to the pair of the electrode terminal 1c which are remainders remained in the punching process (cutting process) in the insulating frame member 6.

Next, the bending process of the electrode board 1 at step S40 is performed to respectively bend the division band-shaped plate portions intervened between the multiple insulating frame members 6 which extend in the longitudinal direction, in such a manner that the folding-back directions of the adjacent division band-shaped plate portions are reversed with respect to each other in the longitudinal direction.

Figure 9:
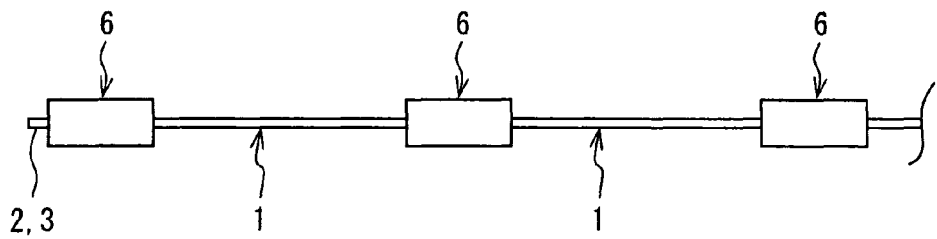
FIG. 9 is a side view showing the thermoelectric conversion module before the element fixing process of step S30 in FIG. 1 is performed.
Figure 10:
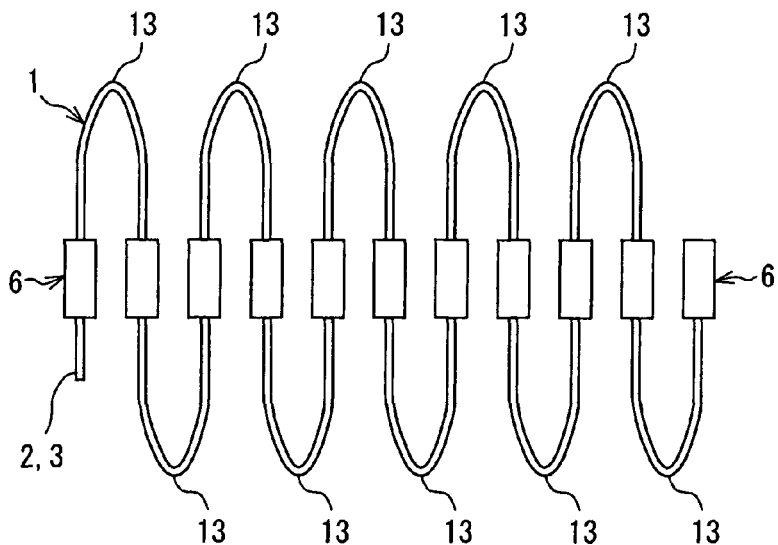
FIG. 10 is a side view showing the thermoelectric conversion module after the bending process of step S40 in FIG. 1 is performed.

That is, the bending process of the electrode board 1 is performed to respectively bend the plate portion 1a of the heat absorbing side 1a and the plate portion 1b of the heat radiating side which linearly connect the multiple insulating frame members 6 arrayed in rows with respect to the longitudinal direction of the electrode board 1 (shown in FIG. 9), in such a manner that the plate portion 1a and the plate portion 1b are folded back to be respectively positioned at the two sides of the insulating frame member 6 as shown in FIG. 10 to have a U-like shape. FIG. 9 is a side view showing the thermoelectric conversion module after the element fixing process is performed. FIG. 10 is a side view showing the thermoelectric conversion module after the bending process is performed.

It is desirable to form incisions 12 at the plate portion 1a and the plate portion 1b before the bending process, so that the bending (in bending process) can be readily performed and the plate portion 1a and the plate portion 1b can be bent at the desirable positions.

Figure 11:
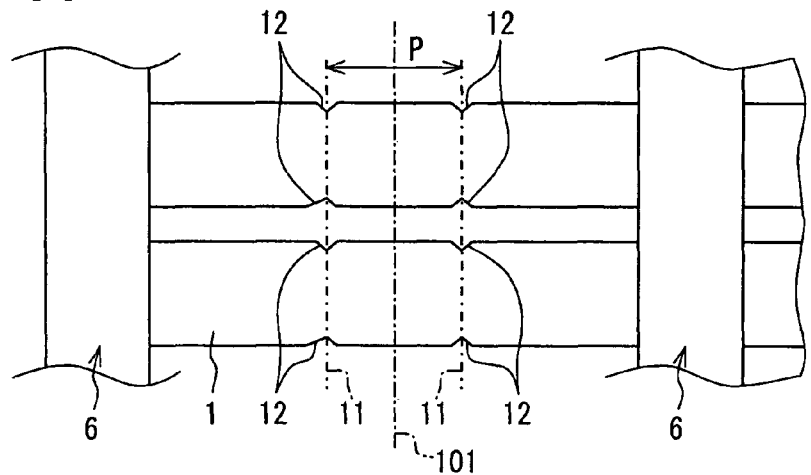
FIG. 11 is a plan view showing the thermoelectric conversion module when incisions are formed before the bending process is performed.

As shown in FIG. 11, it is further desirable to respectively arrange the four incisions 12 at four positions which are arranged at rims of two lateral-direction side of the plate portion 1a (1b) and symmetric to each other with respect to the substantial middle portion (indicated by central line 101) of the longitudinal direction of the plate portion 1a (1b).

In this case, the extension line 11 which connects the two incisions 12 which are arrayed in the lateral direction of the plate portion 1a (1b) is substantially parallel to the central line 101. Furthermore, the longitudinal-direction distance between the two incisions 12 which are arrayed in the longitudinal direction of the plate portion 1a (1b) and symmetric with respect to the central line 101 has a predetermined value P. Moreover, it is preferable to form the incision 12 by stamping in the electrode board stamping process of step S10. FIG. 11 shows the thermoelectric conversion module when the incisions 12 have been formed before the bending process.

In the bending process, the plate portion 1a, 1b having the incision 12 is bent to have a bent portion. The middle portion (indicated by central line 101) of the plate portion 1a (1b) which is spaced from the incisions 12 (respectively positioned at two sides of central line 101) at a same distance constructs a top 13 of the bent portion of the plate portion 1a or 1b. The bent portion of the plate portion 1a, 1b has bend initiation positions at the incisions 12.

Figure 12:
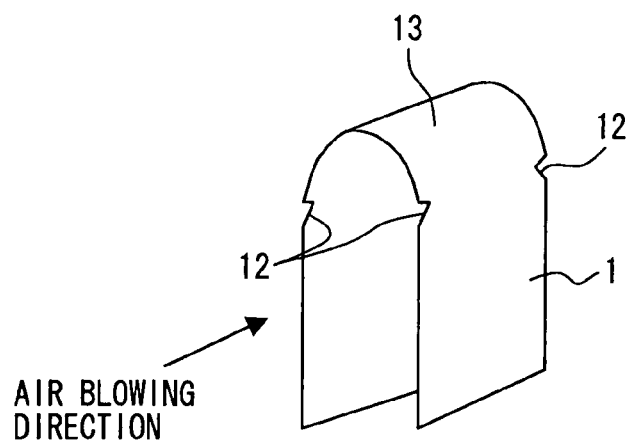
FIG. 12 is a perspective view showing two plate portions after the bending process is performed for the thermoelectric conversion module shown in FIG. 11.

According to this embodiment, the plate portion 1a and the plate portion 1b can respectively construct a heat-radiating fin and a heat-absorbing fin each of which has the top 13 with a smooth bent shape. Furthermore, in this case, the insulating frame members 6 are arranged in line. FIG. 12 shows the electrode portion after the thermoelectric conversion module is provided with the bending process.

In the above-described bending process, the insulating frame members 6 are arrayed in line, by respectively bending the division band-shaped plate portions (each of which is arranged between insulating frame members 6 arrayed in longitudinal direction) in such a manner that the folding-back directions of the adjacent division band-shaped plate portions are alternately reverse to each other.

Figure 13:
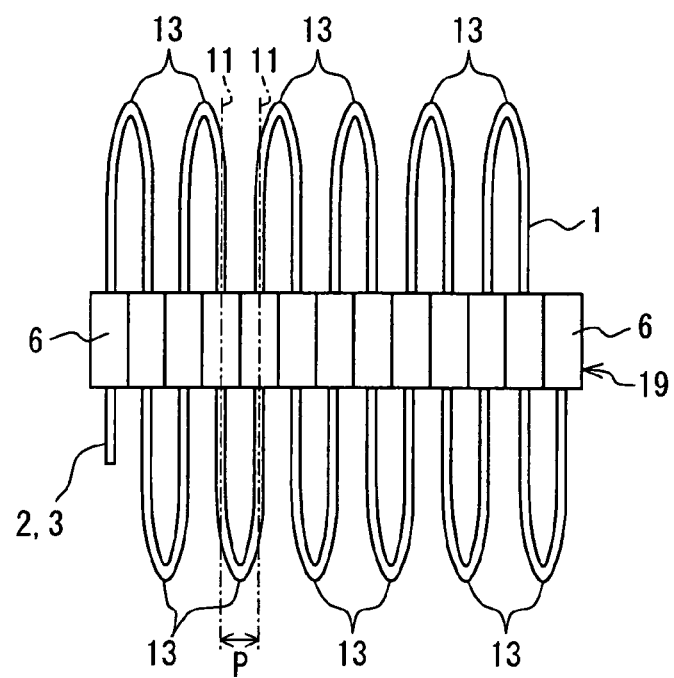
FIG. 13 is a side view showing an electrode board after an insulating frame integrating process is performed for the thermoelectric conversion module to which the bending process has been performed according to the first embodiment.

Next, the insulating frame integrating process of step S50 is performed for the thermoelectric conversion module which has been provided with the bending process shown in FIG. 10. In this case, side portions 16 of the insulating frame members 6 which are adjacent to each other are joined to each other so that the insulating frame members 6 are integrated with each other to construct an insulating unit 19, as shown in FIG. 13. Moreover, as shown in FIG. 13, the plate portions 1a (1b) which are folded back at the two sides of the insulating unit 19 are arrayed at a pitch having the value P in the longitudinal direction. FIG. 13 shows the electrode board 1 after the thermoelectric conversion module (to which bending process has been performed) is provided with the insulating frame integrating process.

That is, the insulating frame integrating process is performed to respectively join the adjacent insulating frame members 6 which are arrayed in line, so that the insulating unit 19 is constructed.

In the insulating frame integrating process, the adjacent insulating frame members 6 can be adhered to each other by an adhesive which is beforehand applied, to be fixed. Alternatively, the adjacent insulating frame members 6 can be also separately fixed to each other by heat-welding or high-frequency welding or the like. More alternatively, all of the adjacent insulating frame members 6 can be also fixed by jig to be adhered. More alternatively, the insulating frame members 6 can be also shaped to be engaged with each other in the insulating frame molding process to be fixed and integrated with each other.

Furthermore, thereafter, it is desirable to perform a process to insulatingly coat the whole of the thermoelectric conversion module, to improve measures against short-circuit and migration.

Figure 14:
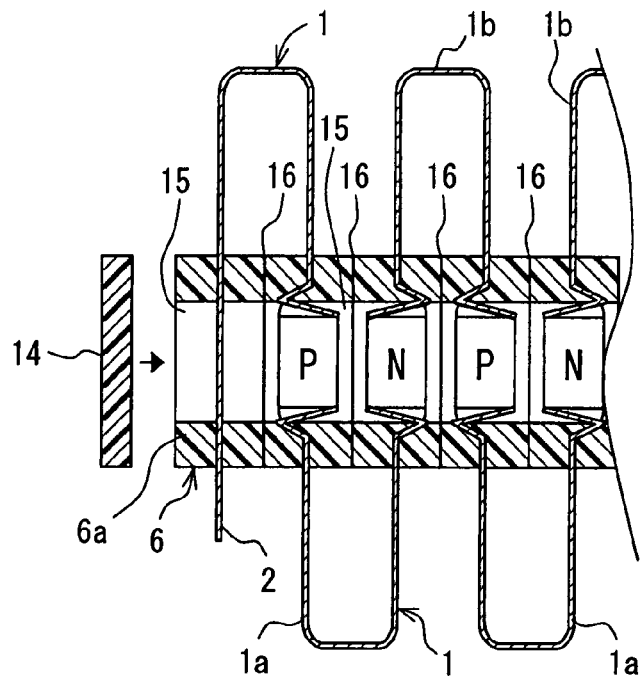
FIG. 14 is a schematic sectional view showing a housing portion which is constructed of a closed space isolated from the exterior according to a modification example of the first embodiment.

In the insulating frame molding process, in the case where the insulating frame members 6 positioned at the two longitudinal-direction ends of the electrode board 1 are not provided with the bottom portion 7, covers 14 can be separately attached to these insulating frame members 6 which are positioned at the two longitudinal-direction ends of the electrode board 1, as shown in FIG. 14. Thus, the housing portion 15 in which the P-type thermoelectric elements 9 and the N-type thermoelectric elements 9 are housed can become a closed space isolated from the exterior.

In the case where the positive terminal and the negative terminal of the direct-current power source are respectively connected with the side of the power connection portion 3 and the side of the power connection portion 2, the electrical current flows from the lower side of the N-type thermoelectric element 9 through the plate portion 1a (of the lower side) to the lower side of the P-type thermoelectric element 9. Thus, energy moves along with electrons in a direction reverse to the direction of the electric current.

Thus, in the N-type thermoelectric element 9, the electrons get the energy to move from the plate portion 1a of the lower side to the N-type thermoelectric element 9 and get the energy to move through the interior of the N-type thermoelectric element 9 to the plate portion 1b of the upper side, from the side of the plate portion 1a positioned at the lower side.

As a result, the energy is insufficient at the side of the plate portion 1a of the lower side so that the temperature becomes low. Therefore, the electrode board 1 (plate portion 1a) positioned at the lower side of the insulating unit 19 in FIG. 15 absorbs heat as the heat-absorbing electrode portion.

On the other hand, at the side of the plate portion 1b of the upper side, the electrons are deprived so that energy is emitted. Thus, the plate portion 1b of the upper side is heated. Therefore, the electrode board 1 (the plate portion 1b) positioned at the upper side of the insulating unit 19 functions as the heat-radiating electrode portion to radiate heat. The heat absorbing amount is proportional to the amplitude of the electrical current and the number of the thermoelectric elements 9.

Figure 15:
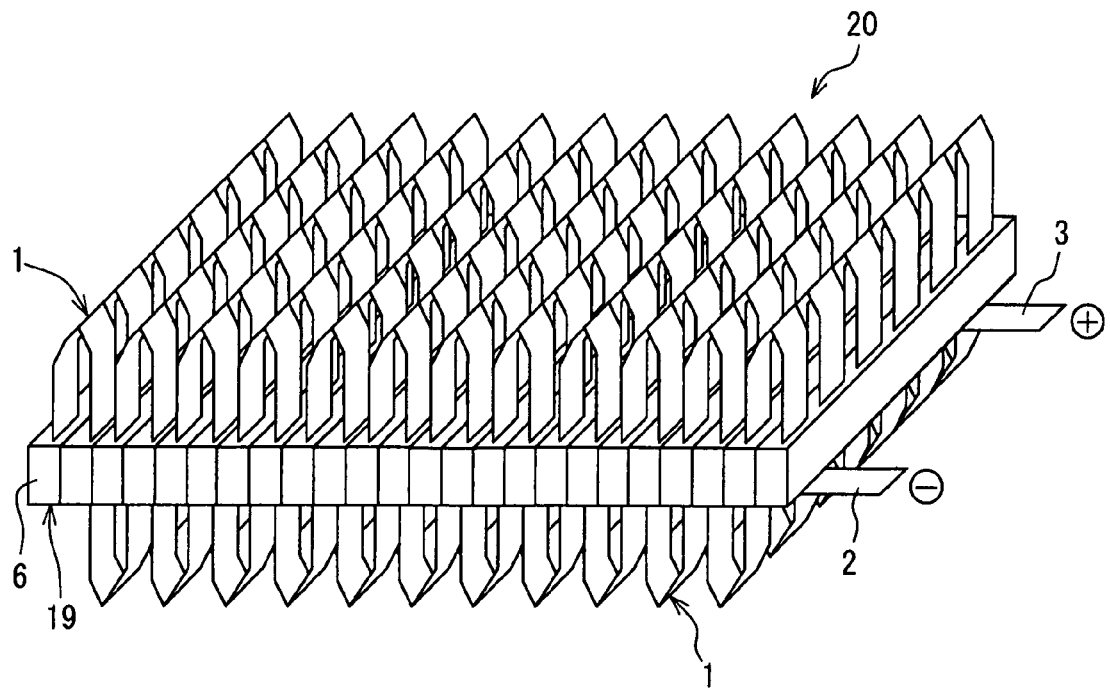
FIG. 15 is a perspective view showing a whole construction of the thermoelectric conversion device according to the first embodiment.

FIG. 15 shows the thermoelectric conversion device 20 manufactured by the above-described processes. That is, the thermoelectric conversion device 20 has the P-type thermoelectric elements 9 and the N-type thermoelectric elements 9, the plate portions 1a of the heat-absorbing side and the plate portion 1b of the heat-radiating side, and the insulating unit 19. The P-type thermoelectric elements 9 and the N-type thermoelectric elements 9 are alternately connected in series to construct the series circuit. The plate portions 1a of the heat-absorbing side and the plate portion 1b of the heat-radiating side respectively function as the heat-absorbing electrode portion and the heat-radiating electrode portion when the series circuit is power-supplied. The insulating unit 19 holds all of the thermoelectric elements 9 in the housing portions 15 in such a manner that the surroundings of the thermoelectric elements 9 are enclosed by the first frame portions 6a and the second frame portions 6b.

That is, for the thermoelectric conversion device 20, the plate portions 1a, 1b which are respectively connected with the adjacent thermoelectric elements 9 are constructed integrally joined to each other at an outer side of the insulating unit 19.

Furthermore, the plate portion 1a and the plate portion 1b respectively construct the heat-radiating fin and the heat-absorbing fin which are respectively positioned at the two sides of the insulating unit 19, and penetrate the first frame portion 6a of the insulating frame member 6 to reach the housing portion 15 to construct the electrode terminal 1c which is integrated with the P-type thermoelectric element 9 or N-type thermoelectric element 9.

According to this embodiment, because the surroundings of the thermoelectric elements 9 are enclosed by the insulating member through the first frame portions 6a and the second frame portions 6b, the short circuit and the migration between the electrode portions can be restricted. The conductive part can be substantially insulated.

Moreover, because the sealing between the insulating unit 19 (to which the plate portion 1a and the plate portion 1b are fixed) and the plate portion 1a, 1b can be maintained, it is unnecessary to separately arrange a sealing material. Furthermore, the electrode terminal 1c (electrically connected with thermoelectric element 9), the heat-radiating fin and the heat-absorbing fin are constructed of a same component to be formed by stamping, so that the productivity can be increased and the material cost can be reduced.

Furthermore, according to this embodiment, the two ends of the plate portion 1a, 1b which connect the P-type thermoelectric elements 9 and the N-type thermoelectric elements 9 (alternately arrayed) in series to construct the series circuit are used as the power connection portion 2 and the power connection portion 3 through which the power is supplied. Thus, the plate portion 1a, 1b can double as the electrode portion (heat radiating electrode portion/heat absorbing electrode portion) and the power source connection portion, so that it is unnecessary to separately provide the power source connection portion.

Moreover, because the heat transferring elements and the electrode portions are joined to each other by soldering or the like, that is, by metal-joining, the heat resistance is low. Therefore, the capacity of the heat transferring element can be sufficiently exerted.

Furthermore, each of the heat transferring elements is surrounded by the insulating frame member 6 and arranged in the housing portion 15, so that the freezing and the migration can be restricted. Moreover, the heat stress can be reduced.

According to this embodiment, the insulating unit 19 is provided with the multiple insulating frame members 6 in each of which the P-type thermoelectric elements 9 having the predetermined number and the N-type thermoelectric elements 9 having the predetermined number are embedded. The multiple insulating frame members 6 (having side portions 16 which are joined to each other) are integrated with each other to construct the insulating unit 19. Thus, the multiple modules each of which has the P-type thermoelectric elements 9 having the predetermined number and the N-type thermoelectric elements 9 having the predetermined number can be combined to construct the thermoelectric conversion device. Therefore, the thermoelectric conversion device having the required capacity can be readily manufactured.

According to this embodiment, the resin is adhered to parts of the multiple plate portions 1a, 1b by molding so that the insulating frame member 6 which is an integrally molded product is constructed. Thus, the insulating frame member 6 is molded integrally with the plate portions 1a and the plate portions 1b by insert molding or outsert molding, so that the seal between the plate portion 1a, 1b and the insulating frame member 6 which contacts the plate portion 1a, 1b can be improved. Thus, it is unnecessary to separately provide a seal material between the plate portion 1a, 1b and the insulating frame member 6.

Moreover, the housing portion 15 is constructed in the closed space which is isolated from the exterior. Thus, the humidity can be restricted from intruding, and the condensation in the housing portion 15 and the corrosion of the thermoelectric elements 9 and the like can be restricted.

Furthermore, it is preferable to fill the closed space with the material having the lower heat conductivity than air. Thus, the condensation in the housing portion 15 and the corrosion of the thermoelectric elements 9 and the like can be further restricted. Furthermore, the heat loss amount (due to convection of air) of the temperature difference occurring between at the two ends of the thermoelectric elements 9 due to the power supply to the device can be reduced.

In this embodiment, it is describable that the closed space is vacuum or is in a low pressure state (where air exists) close to vacuum. Thus, the condensation in the housing portion 15 and the corrosion of the thermoelectric elements 9 and the like can be further restricted.

Moreover, the plate portion 1a, 1b is provided with the coupling surface which faces the surface of the thermoelectric element 9 and is coupled with this surface. It is preferable for the plate portion 1a, 1b and the N-type and P-type thermoelectric elements 9 to be coupled in such a state that the coupling surface tightly contacts the surfaces of the N-type and P-type thermoelectric elements 9. Thus, the soldering area can be enlarged so that the quality of the soldering can be stabilized.

Furthermore, it is desirable to plate (apply a coating to) the plate portion 1a and the plate portion 1b. Thus, in the case where the electrode terminal 1c and the thermoelectric elements 9 are soldered, the soldering wettability can be improved and the migration can be restricted.

Second Embodiment

Figure 16:
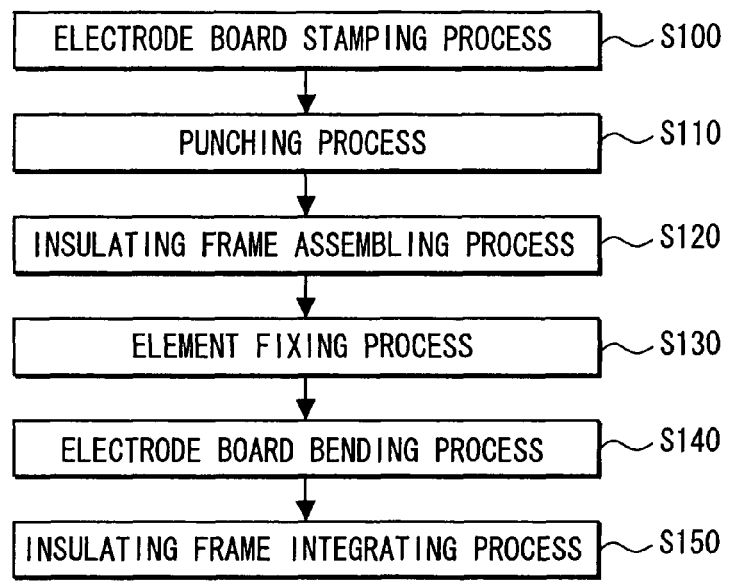
FIG. 16 is a flow chart showing manufacture processes of a thermoelectric conversion device according to a second embodiment of the present disclosure.

A second embodiment according to the present invention will be described with reference to FIGS. 16-18. As shown in FIG. 16, the manufacture of the thermoelectric conversion device 20 includes the stamping process (electrode board constructing process at step S100) of the electrode board 1, the punching process (step S110), an insulating frame assembling process (step S120), the element fixing process (step S130), the bending process of the electrode board 1 (step S140) and the insulating frame integrating process (step S150).

In this embodiment, the insulating frame member 6 is not formed integrally with the plate portion 1a and the plate portion 1b as described in the first embodiment. The insulating frame member 6 is formed separately from the plate portion 1a and 1b, and then assembled with the plate portion 1a and the plate portion 1b. FIG. 17 shows the state before the plate portion 1a, 1b and a first frame portion 17 and a second frame portion 18 are assembled. FIG. 18 shows the state after the plate portion 1a, 1b and the first frame portion 17 and the second frame portion 18 are assembled and the thermoelectric elements 9 are fixed.

Figure 17:
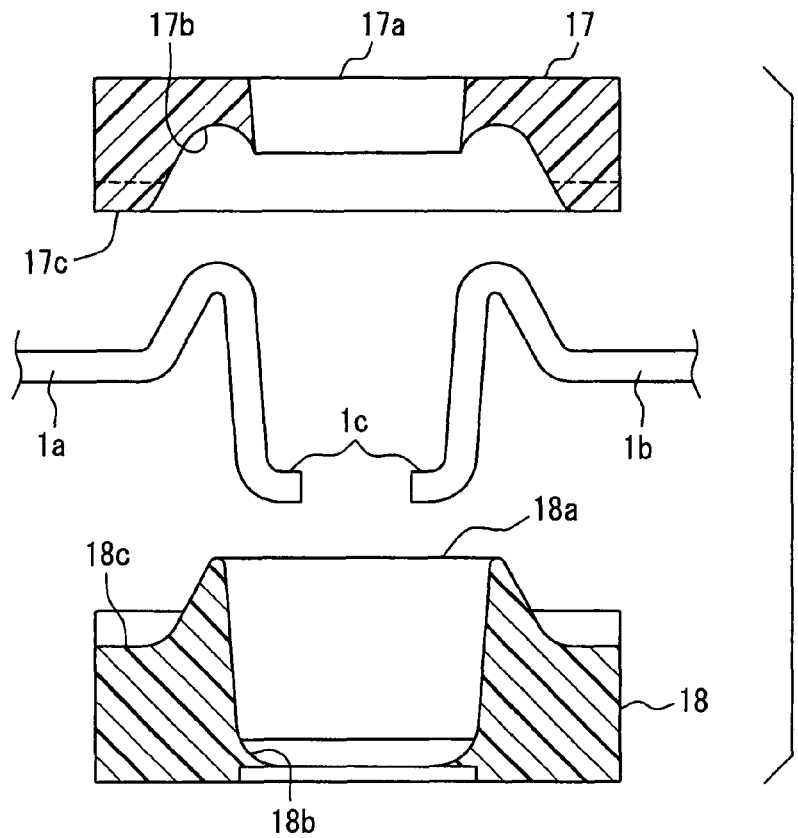
FIG. 17 is a schematic sectional view showing a state before two plate portions and an insulating frame member are assembled according to the second embodiment.
Figure 18:
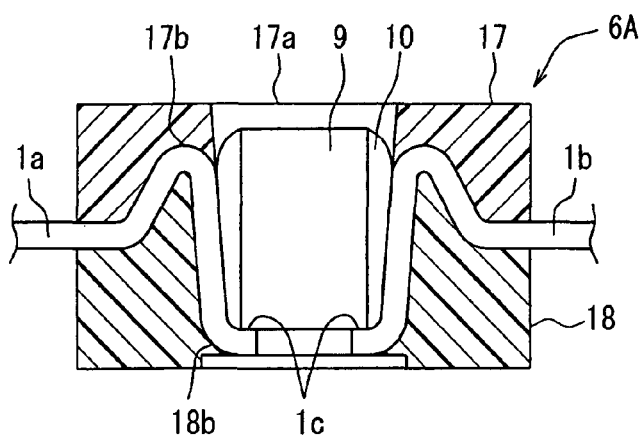
FIG. 18 is a schematic sectional view showing a state where the two plate portions and the insulating frame member in FIG. 17 are assembled and a thermoelectric element is further fixed according to the second embodiment.

As shown in FIGS. 17 and 18, the insulating frame member 6 is constructed of the first frame portion 17, and the second frame portion 18 which is integrated with the first frame portion 17 to sandwich the plate portion 1a and the plate portion 1b therebetween.

The first frame portion 17 has an opening portion 17a through which the thermoelectrical element 9 is inserted, a joining portion 17c which is to tightly contact the second frame portion 18, and a holding portion 17b which holds therein the plate portion 1a, 1b together with the second frame portion 18. The opening portion 17a and the joining portion 17c are respectively positioned at two sides of the first frame portion 17.

On the other hand, the second frame portion 18 has an opening portion 18a through which the plate portion 1a, 1b and the thermoelectrical element 9 are inserted, a joining portion 18c which is to tightly contact the first frame portion 17, and a holding portion 18b which holds therein the plate portion 1a, 1b together with the first frame portion 17. The opening portion 18a and the holding portion 18b are respectively positioned at two sides of the second frame portion 18.

According to this embodiment, the punching process (step S110) for forming the electrode board 1 having the predetermined shape is performed after the stamping process of step S100 (similar to step S10 of above-described first embodiment) of the electrode board 1. Thereafter, the insulating frame assembling process (step S120) is performed after the punching process. The steps of the manufacture of the thermoelectric conversion device after the insulating frame assembling process are the same with those of the first embodiment.

In the second embodiment, the stamping process (step S100) similar to step S10 in the first embodiment is performed. Then, the punching process is performed to punch the plane portions of the electrode board 1 to form the electrode terminal portions 1c spaced from each other at a predetermined distance. In this punching process, the bridge portions 5 which are spaced from each other at the predetermined distance in the longitudinal direction and the parts of the band-shaped plate members which are connected through the bridge portions 5 are punched, to form the division band-shaped plate portions (plate portion 1a and the plate portion 1b) into which the band-shaped plate member is divided in the longitudinal direction and form the electrode terminals 1c at the ends of the division band-shaped plate portions.

Next, the insulating frame assembling process is performed. In this case, the division band-shaped plate portions (plate portions 1a and 1b) which are arrayed in rows with respect to the lateral direction are sandwiched by the two frame portions (first frame portion 17 and second frame portion 18) which surround the whole of the division band-shaped plate portions through the lateral direction. Thus, the insulating frame member 6 is formed.

Furthermore, the multiple insulating frame members 6 are attached to the electrode board 1 in such a manner that the insulating frame members 6 are arrayed in the longitudinal direction corresponding to the parts of the band-shaped plate members which have been punched at the punching process. The electrode terminal 1c which is formed by punching in the punching process is exposed in the insulating frame member 6.

The insulating frame unit assembling process is performed to assemble the plate portion 1a, the plate portion 1b, the first frame portion 17 and the second frame portion 18. In this process, at first, the plate portion 1a and the plate portion 1b are respectively inserted from the opening portion 18a of the second frame portion 18 to be held by the holding portion 18b. Then, the first frame portion 17 where an adhesive is beforehand applied to the joining portion 17c is integrally assembled with the second frame portion 18 such that the plate portion 1a and the plate portion 1b are sandwiched therebetween. Thus, the insulating frame member 6 is constructed. In this case, the assembling is performed in such a manner that the plate portion 1a and the plate portion 1b are held by the holding portion 17b and the joining portion 17c contacts the joining portion 18c.

Furthermore, the thermoelectrical element 9 is inserted from the opening portion 17a with respect to the plate portion 1a, 1b and the insulating frame member 6 which are assembled as described above, and arranged to contact the electrode terminal 1c of each of the plate portion 1a and the plate portion 1b. Thus, the soldering of the electrode terminal 1c and the thermoelectrical element 9 are performed in a reflow furnace, so that a soldering portion 10 is formed.

It is desirable to arrange a sealing member between the part of the insulating frame member 6 (where the plate portion 1a, 1b penetrates and contacts the insulating frame member 6) and the plate portion 1a, 1b, that is, between the joining portion 17c, 18c and the plate portion 1a, 1b. The seal member can be constructed by applying an adhesive, for example, an epoxy resin or a silicon adhesive.

As described above, according to this embodiment, the manufacture of the thermoelectric conversion device includes the electrode board constructing process, the punching process, the insulating frame assembling process, the element fixing process, the bending process of the electrode board 1 and the insulating frame integrating process. In the punching process, the bridge portion 5 is punched to form the division band-shaped plate portions (the plate portion 1a and the plate portion 1b) into which the band-shaped plate member is divided in the longitudinal direction and form the electrode terminals 1c at the ends of the division band-shaped plate portions. In the insulating frame assembling process, the insulating frame members 6 are assembled with the electrode board 1 to be positioned at the two sides of the longitudinal direction of the bridge portion 5 and spaced from the bridge portion 5 at the predetermined distance, in such a manner that the insulating frame members 6 are spaced from each other at the predetermined distance in the longitudinal direction. The insulating frame members 6 includes the first frame portion 17 and the second frame portion 18 which connect the multiple band-shaped plate members (the plate portion 1a and the plate portion 1b) in the lateral direction. The electrode terminal 1c is sandwiched by the first frame portion 17 and the second frame portion 18, and exposed in a space defined by the first frame portion 17 and the second frame portion 18 therebetween.

According to this manufacture method, the division band-shaped plate portions integrated with the multiple insulating frame members 6 are folded back at the two sides of the insulating frame member 6, so that the adjacent insulating frame members 6 have the reverse folding-back directions. Thus, the multiple insulating frame members 6 can be arrayed substantially in line. These insulating frame members 6 are integrated. Thus, the component number and the assembling labor can be reduced. The manufacture method having a stable manufacture quality can be provided. Moreover, the thermoelectric elements 9 are surrounded by the insulating frame member 6 to be housed in the insulating unit, the migration and the short circuit between the electrode members can be restricted.

According to this embodiment, the insulating frame member 6 has the first frame portion 17, and the second frame portion 18 which is integrated with the first frame portion 17, and holds the plate portion 1a and the plate portion 1b. Thus, the die cost for molding the insulating frame unit can be reduced, and the thermoelectric conversation device 20 readily corresponding to a production of a modest quantity can be provided.

About the manufacture and the construction of the thermoelectric conversion device 20, what has not described in the second embodiment is the same with the first embodiment.

Third Embodiment

A third embodiment of the present invention will be described with reference to FIGS. 19A-19C. In this case, heat-transference enhancing units (for example, louver 21) are provided for the plate portions 1a and 1b (heat radiating fin and heat absorbing fin) which are positioned at the two sides of the insulating unit 19, to improve the heat transference between air and the fin.

Figure 19A:
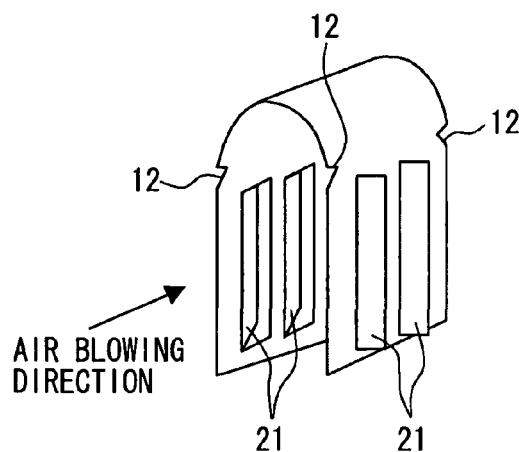
FIG. 19A is a schematic perspective view showing a plate portion where a louver is arranged.

As shown in FIG. 19A, the plate portion 1a, 1b is provided with the multiple louvers 21 which are lanced (cut and raised) from the surface of the plate portion 1a, 1b and protrudes outward. The louver 21 constructs inclined surface portions which stand outward from the surface of the fin, so that a flow where blown air expands from the surface to the outer side is formed. Thus, the heat transferring areas of the heat radiating fin portion and the heat absorbing fin portion can be increased.

Figure 19B:
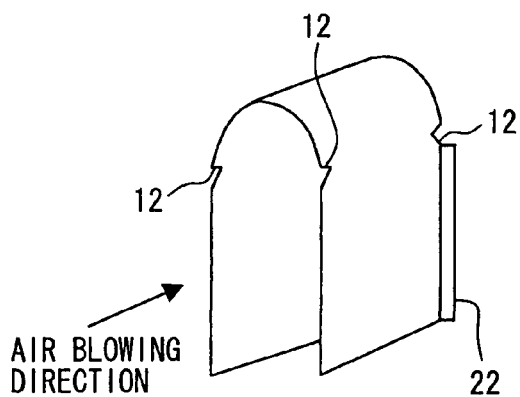
FIG. 19B is a schematic perspective view showing a plate portion where a wing is arranged at a rear rim thereof of an air blowing direction.

Moreover, as shown in FIG. 19B, the plate portion 1a, 1b can be also provided with wings 22 (as heat-transference enhancing unit) each of which is positioned at a rear rim (with respect to air blowing direction) of the plate portion 1a, 1b and protrudes from the surface of the rear rim toward the outer side. The wing 22 constructs an inclined surface portion which protrudes from the surface of the rear edge toward the outer side, so that a flow where air blown along the surface of the fin expands from the surface (of rear edge of fin) toward the outer side can be caused. Thus, the flow of air near the surfaces of the heat radiating fin and the heat absorbing fin can be disturbed, so that the heat transference can be improved.

Figure 19C:
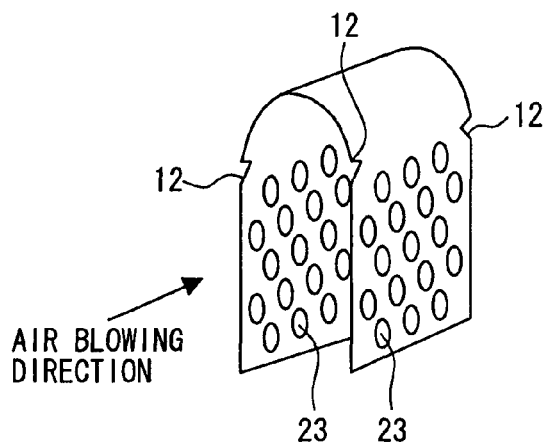
FIG. 19C is a schematic perspective view showing a plate portion where dimples are arranged at a surface thereof according to a third embodiment of the present invention.

As shown in FIG. 19C, the plate portion 1a, 1b can be also provided with multiple dimples (potholes) 23 as the heat-transference enhancing unit which are arranged at the facade surface (outer surface) or the back surface (inner surface) of the fin portion. Because of the dimple 23, air blown along the surface of the fin will come off in scales at the surface of the fin to cause a flow where eddy occurs. Thus, the air flow near the surfaces of the heat radiating fin and the heat absorbing fin can be disturbed, thus improving the heat transference.

About the manufacture and the construction of the thermoelectric conversion device 20, what has not described in the third embodiment is the same with the first embodiment.

In this embodiment, the heat transference enhancing unit is arranged at the plate portions 1a and 1b which are respectively positioned at the two sides of the insulating unit 19 to enhance the heat transference between the plate portion 1a, 1b and air flowing. Thus, the heat transference capacity of the thermoelectric conversion device can be improved.

In this case, the heat transference enhancing unit can be constructed of the louver 21 which protrudes from the surface of the plate portion 1a, 1b. Thus, the heat transference areas of the heat absorbing fin and the heat radiating fin (plate portions 1a and 1b) can be increased.

Furthermore, the heat transference enhancing unit can be constructed of the dimples 23 (potholes) arranged at the outer surface or the inner surface of the plate portion 1a, 1b. In this case, the air flow near the surface of the heat radiating fin or the heat absorbing fin can be disturbed, so that the heat transference can be improved.

Fourth Embodiment

A fourth embodiment of the present invention will be described with reference to FIG. 20. According to this embodiment, at first, the thermoelectric conversion module in which the insulating frame member 6 houses therein the thermoelectric element 9 electrically connected with the electrode portion (plate portion 1a or plate portion 1b) is formed. The electrode portions are combined with each other so that the thermoelectric conversion modules are electrically connected with each other.

Figure 20:
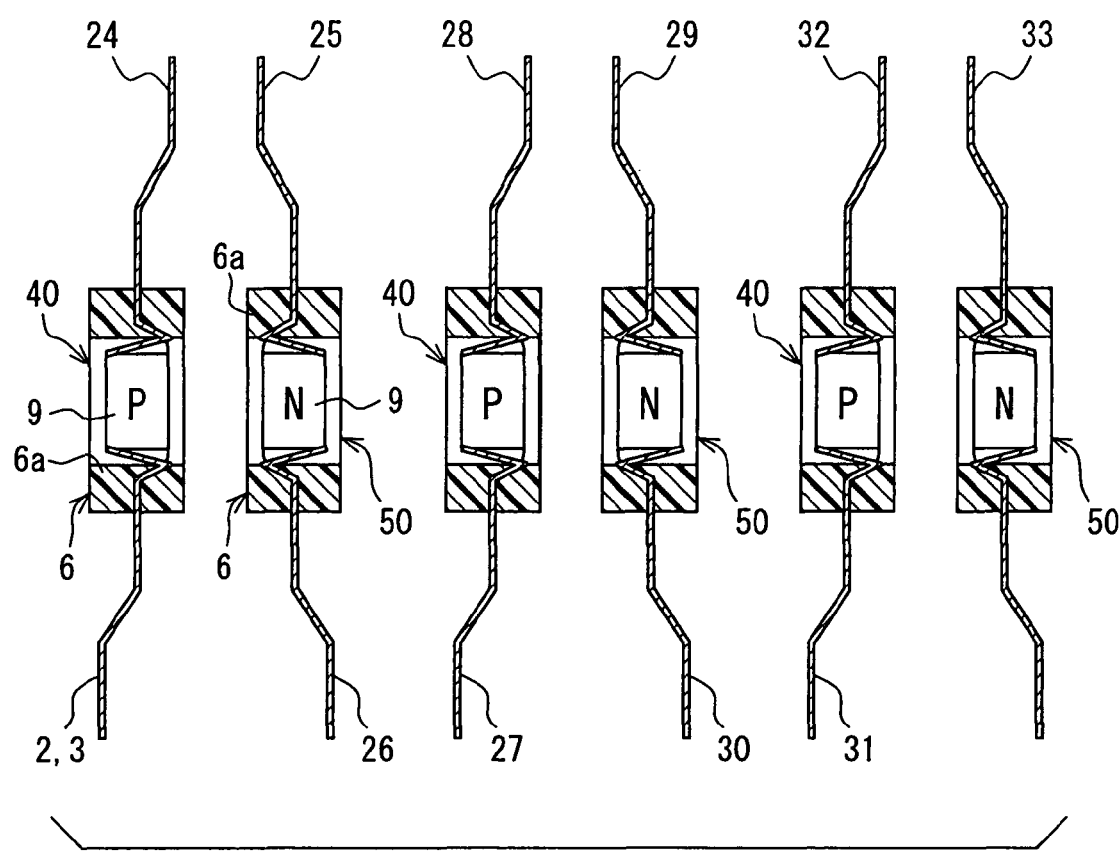
FIG. 20 is a schematic sectional view showing a manufacture method of a thermoelectric conversion device according to a fourth embodiment of the present disclosure.

As shown in FIG. 20, the manufacture of the thermoelectric conversion device 20 includes a module constructing process, a connecting process and the insulating frame integrating process described in the first embodiment. In the module constructing process, the thermoelectric conversion modules 40 of the predetermined number and the thermoelectric conversion modules 50 of the predetermined number are manufactured. The thermoelectric conversion module 40 is provided with the insulating frame member 6 in which the P-type thermoelectric element 9 electrically connected with the electrode terminal 1c is housed. The thermoelectric conversion module 50 is provided with the insulating frame member 6 in which the N-type thermoelectric element 9 electrically connected with the electrode terminal 1c is housed. In the connecting process, the thermoelectric conversion modules 40 and the thermoelectric conversion modules 50 are alternately arrayed to construct the series circuit, and the electrode portions are connected with each other such that the heat absorbing fin and the heat radiating fin are constructed.

Moreover, the module constructing process includes a process in which the electrode portion is formed by stamping similarly to the electrode board stamping process of the first embodiment, the insulating frame molding process and the element fixing process described in the first embodiment.

As shown in FIG. 20, in the connecting process, the electrode portion 24 and the electrode portion 25, the electrode portion 26 and the electrode portion 27, the electrode portion 28 and the electrode portion 29, the electrode portion 30 and the electrode portion 31, the electrode portion 32 and the electrode portion 33, and the like are respectively joined to each other by soldering, welding or the like, so that the thermoelectric conversion modules 40 and the thermoelectric conversion modules 50 which are alternately arrayed construct the series circuit. The electrode portions positioned at the two ends of the series circuit construct the power source connection portions 2 and 3.

According to this embodiment, the die cost can be reduced and the thermoelectric conversation device readily corresponding to a production of a modest quantity can be provided.

Other Embodiment

Although the present invention has been fully described in connection with the preferred embodiments thereof with reference to the accompanying drawings, it is to be noted that various changes and modifications will become apparent to those skilled in the art.

For example, in the above-described embodiments, the positive terminal and the negative terminal of the direct current power source are respectively connected with the power source connection portions 3 and 2. However, the positive terminal and the negative terminal of the direct current power source can be respectively connected with the power source connection portions 2 and 3. In this case, the heat radiating portion and the heat absorbing portion which are integrated with the electrode portions positioned at the two sides of the insulating unit 19 reverses.

That is, the heat radiating side and the heat absorbing side can be switched by switching the electrical current direction flowing in the series circuit constructed by the N-type thermoelectric elements 9 and the P-type thermoelectric elements 9 which are alternately arrayed. The thermoelectric conversation device 20 according to the present invention can be suitably used to cool a heat-generating component such as a semiconductor component or an electrical component, or to heat as a heating device, for example.

Moreover, the plate portion 1a, 1b can be also fixed to the thermoelectric element 9 by spot-welding, swaging or the like, in addition to soldering.

Such changes and modifications are to be understood as being in the scope of the present invention as defined by the appended claims.

What is claimed is:

1. A manufacture method of a thermoelectric conversion device, comprising:
an electrode board constructing process for constructing an electrode board, where a plurality of band-shaped plate members extending in a longitudinal direction thereof are arrayed in rows with respect to a lateral direction thereof in such a manner that the band-shaped plate members are spaced from each other at a predetermined distance in the lateral direction and a plurality of bridge portions are arrayed in rows with respect to the longitudinal direction of the band-shaped plate member in such a manner that the bridge portions are spaced from each other at a predetermined distance in the longitudinal direction of the band-shaped plate member, each of the bridge portions connecting the band-shaped plate members with each other in the lateral direction of the band-shaped plate member;

an insulating frame molding process for molding a plurality of insulating frame members integrally with the electrode board in such a manner that the insulating frame members are spaced from each other at a predetermined distance in the longitudinal direction of the band-shaped plate member, the insulating frame member being arranged at two sides of the bridge portion and spaced from the bridge portion at a predetermined distance, the two sides being defined with respect to the longitudinal direction of the band-shaped plate member, the insulating frame member having a pair of first frame portions which connect the plurality of band-shaped plate members in the lateral direction of the band-shaped plate member, and a pair of second frame portions which connect the pair of first frame portions;

a cutting process for cutting the bridge portion in such a manner that the band-shaped plate member has a remainder remained in the insulating frame member;

an element fixing process for electrically joining P-type thermoelectric elements and N-type thermoelectric elements in the insulating frame member to the remainders;

a bending process for respectively folding-back the band-shaped plate members positioned between the adjacent insulating frame members in such a manner that folding-back directions of the band-shaped plate members are alternately reverse to each other in the longitudinal direction thereof; and an insulating frame integrating process for joining the plurality of insulating frame members to each other to construct an insulating member unit in such a manner that the plurality of insulating frame members are arranged substantially in line.

2. The manufacture method according to claim 1, wherein in the electrode board constructing process, connection portions are formed at two ends of a longitudinal direction the electrode board, to respectively connect the adjacent band-shaped plate members which are arrayed in rows with respect to the lateral direction thereof.

3. The manufacture method according to claim 1, wherein the insulating frame member formed in the electrode board constructing process is made of one of a thermoplastic resin and a thermosetting resin.

4. The manufacture method according to claim 1, wherein before the bending process, incisions are formed at the band-shaped plate member which is arranged between the adjacent insulating frame members and folded-back in the bending process.

5. The manufacture method according to claim 1, wherein in the insulating frame molding process, the insulating frame member is molded to house therein the bridge portion and parts of the band-shaped plate members, each of which has a predetermined length.

6. The manufacture method according to claim 1, wherein the band-shaped plate member is formed to have an heat-transference enhancing unit which is constructed of at least one of a louver which is lanced from a surface of the plate band-shaped plate member and protrudes outward, a wing which is positioned at a rear rim of an air blowing direction of the band-shaped plate member and protrudes outward, and dimples which are arranged at the surface of the plate band-shaped plate member.

* * * * *